(12) United States Patent
Nishihata et al.

(10) Patent No.: US 11,355,304 B2
(45) Date of Patent: Jun. 7, 2022

(54) ELECTRONIC MICROSCOPE DEVICE

(71) Applicant: HITACHI HIGH-TECH CORPORATION, Tokyo (JP)

(72) Inventors: Takahiro Nishihata, Tokyo (JP); Mayuka Osaki, Tokyo (JP); Wei Sun, Tokyo (JP); Takuma Yamamoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 15/734,367

(22) PCT Filed: Jun. 14, 2018

(86) PCT No.: PCT/JP2018/022758
§ 371 (c)(1),
(2) Date: Dec. 2, 2020

(87) PCT Pub. No.: WO2019/239546
PCT Pub. Date: Dec. 19, 2019

(65) Prior Publication Data
US 2021/0225608 A1    Jul. 22, 2021

(51) Int. Cl.
*H01J 37/21* (2006.01)
*H01J 37/22* (2006.01)
(Continued)

(52) U.S. Cl.
CPC ............ *H01J 37/21* (2013.01); *H01J 37/222* (2013.01); *H01J 37/244* (2013.01); *H01J 37/28* (2013.01);
(Continued)

(58) Field of Classification Search
CPC ........ H01J 37/21; H01J 37/222; H01J 37/244; H01J 37/28; H01J 2237/216; H01J 2237/221; H01J 37/22; G01B 15/00
See application file for complete search history.

(56) References Cited

U.S. PATENT DOCUMENTS

| | | | |
|---|---|---|---|
| 5,396,281 A | 3/1995 | Maeda | |
| 7,838,840 B2 * | 11/2010 | Kobaru | ................... H01J 37/21 250/396 R |

(Continued)

FOREIGN PATENT DOCUMENTS

| | | |
|---|---|---|
| JP | S57-173258 A | 11/1982 |
| JP | H5-236348 A | 9/1993 |

(Continued)

OTHER PUBLICATIONS

International Search Report and English Translation, PCT/JP2018/022758, dated Sep. 18, 2018, 4 pgs.

*Primary Examiner* — David A Vanore
(74) *Attorney, Agent, or Firm* — Volpe Koenig

(57) ABSTRACT

In the present invention, an electro-optical condition generation unit includes: a condition setting unit that sets, as a plurality of electro-optical conditions, a plurality of electro-optical conditions in which the combinations of the aperture angle and the focal-point height for an electron beam are different; an index calculating unit that determines a measurement-performance index in the electro-optical conditions set by the condition setting unit; and a condition deriving unit that derives an electro-optical condition, including an aperture angle and a focal-point height, so that the measurement-performance index determined by the index calculating unit becomes a prescribed value.

15 Claims, 15 Drawing Sheets

(51) Int. Cl.
*H01J 37/244* (2006.01)
*H01J 37/28* (2006.01)

(52) U.S. Cl.
CPC ... *H01J 2237/216* (2013.01); *H01J 2237/221* (2013.01)

(56) References Cited

U.S. PATENT DOCUMENTS

| | | | |
|---|---|---|---|
| 10,481,373 B2* | 11/2019 | Lee | G02B 21/245 |
| 10,847,343 B1* | 11/2020 | Own | C23C 14/24 |
| 11,056,310 B2* | 7/2021 | Kawamoto | H01J 37/1471 |
| 2007/0200947 A1* | 8/2007 | Kobaru | H01J 37/21 |
| | | | 348/345 |
| 2008/0116376 A1* | 5/2008 | Takane | G06T 5/20 |
| | | | 250/307 |
| 2009/0314938 A1 | 12/2009 | Sato et al. | |
| 2015/0136979 A1* | 5/2015 | Tachibana | H01J 37/10 |
| | | | 250/310 |

FOREIGN PATENT DOCUMENTS

| | | |
|---|---|---|
| JP | 2006-107919 A | 4/2006 |
| JP | 2006-190693 A | 7/2006 |
| JP | 2007-227207 A | 9/2007 |
| JP | 2014-002835 A | 1/2014 |
| JP | 2014-143031 A | 8/2014 |

* cited by examiner

[FIG. 1A]
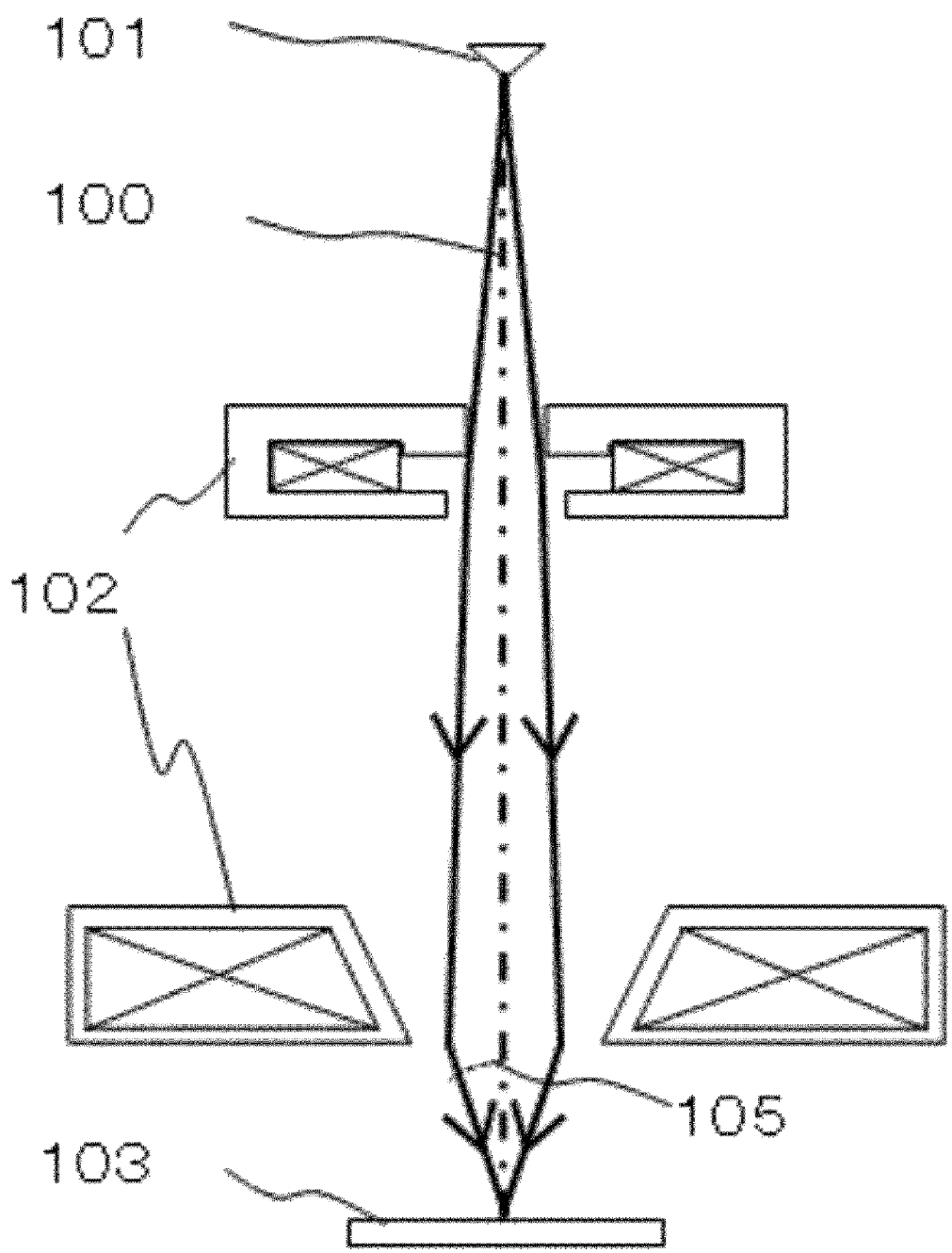

[FIG. 1B]
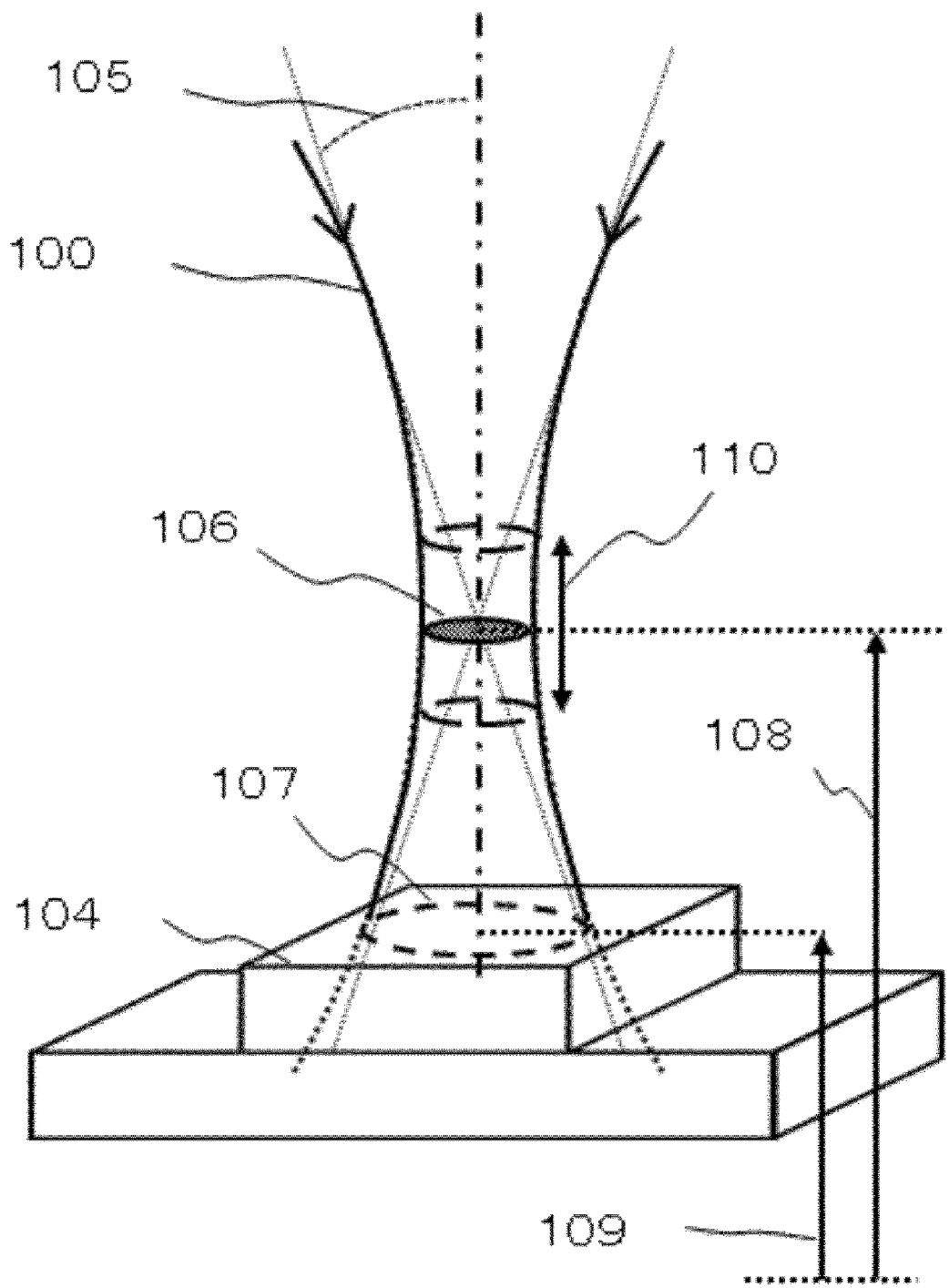

[FIG. 2A]
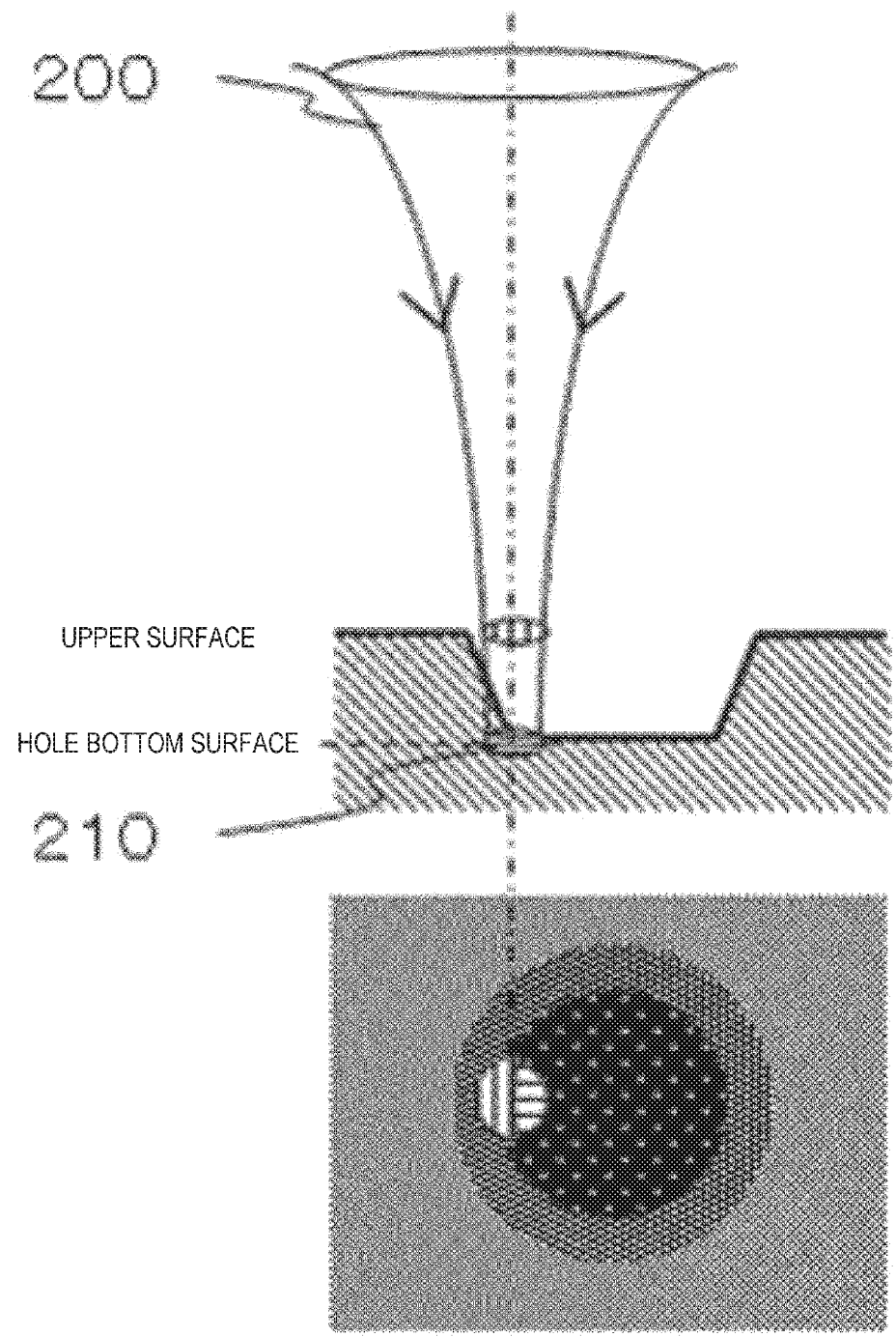

[FIG. 2B]
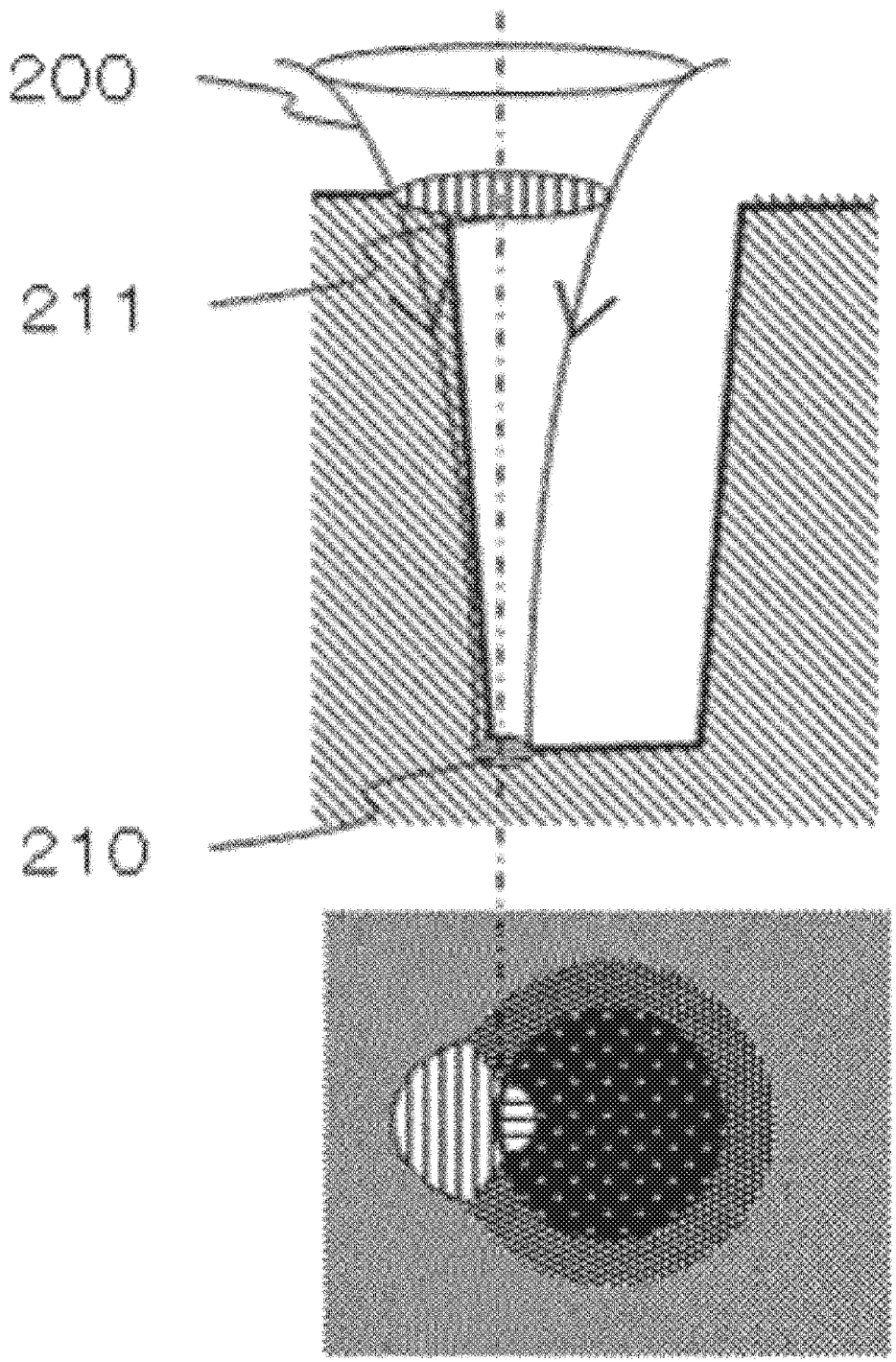

[FIG. 2C]
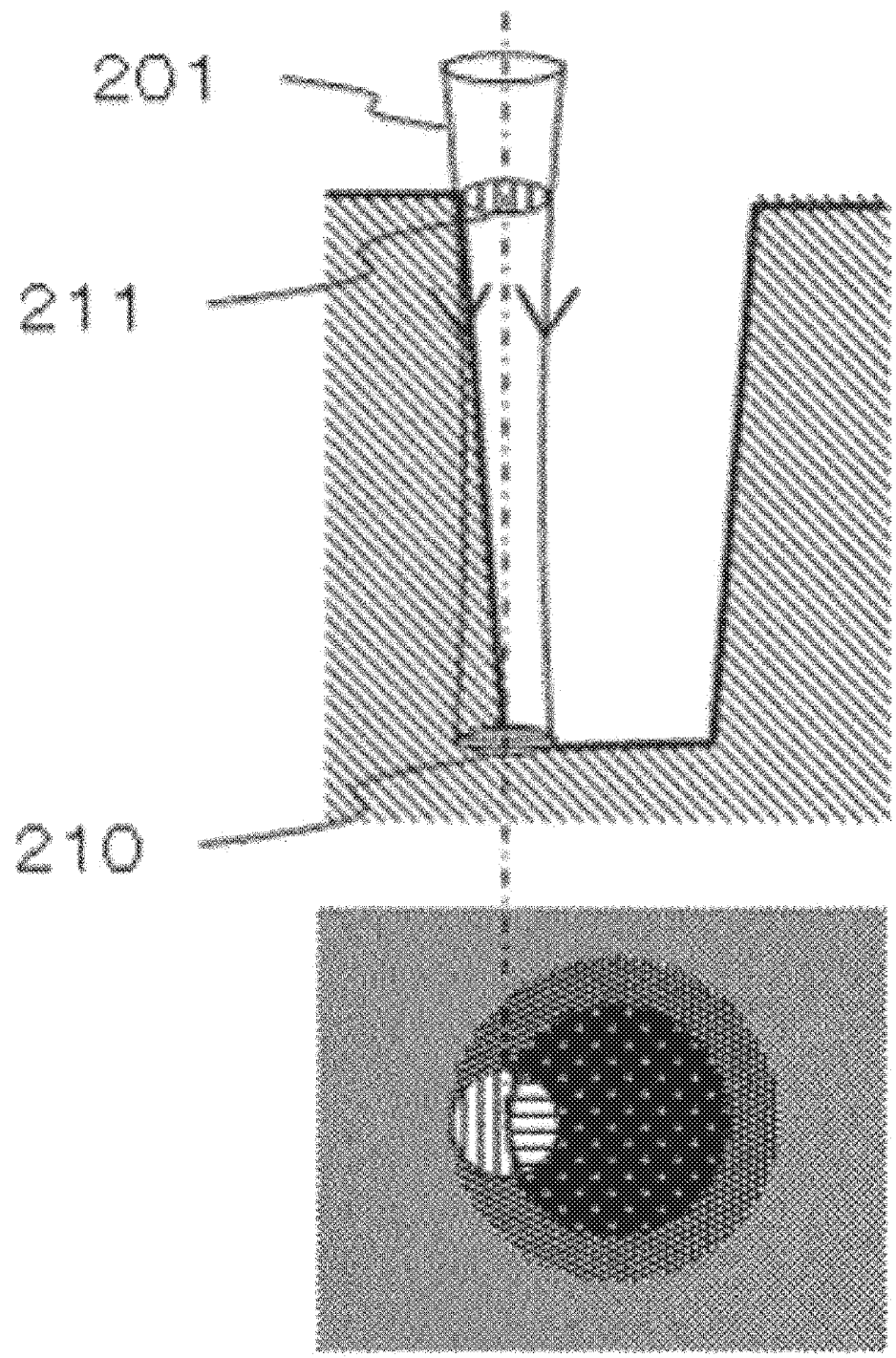

[FIG. 3A]
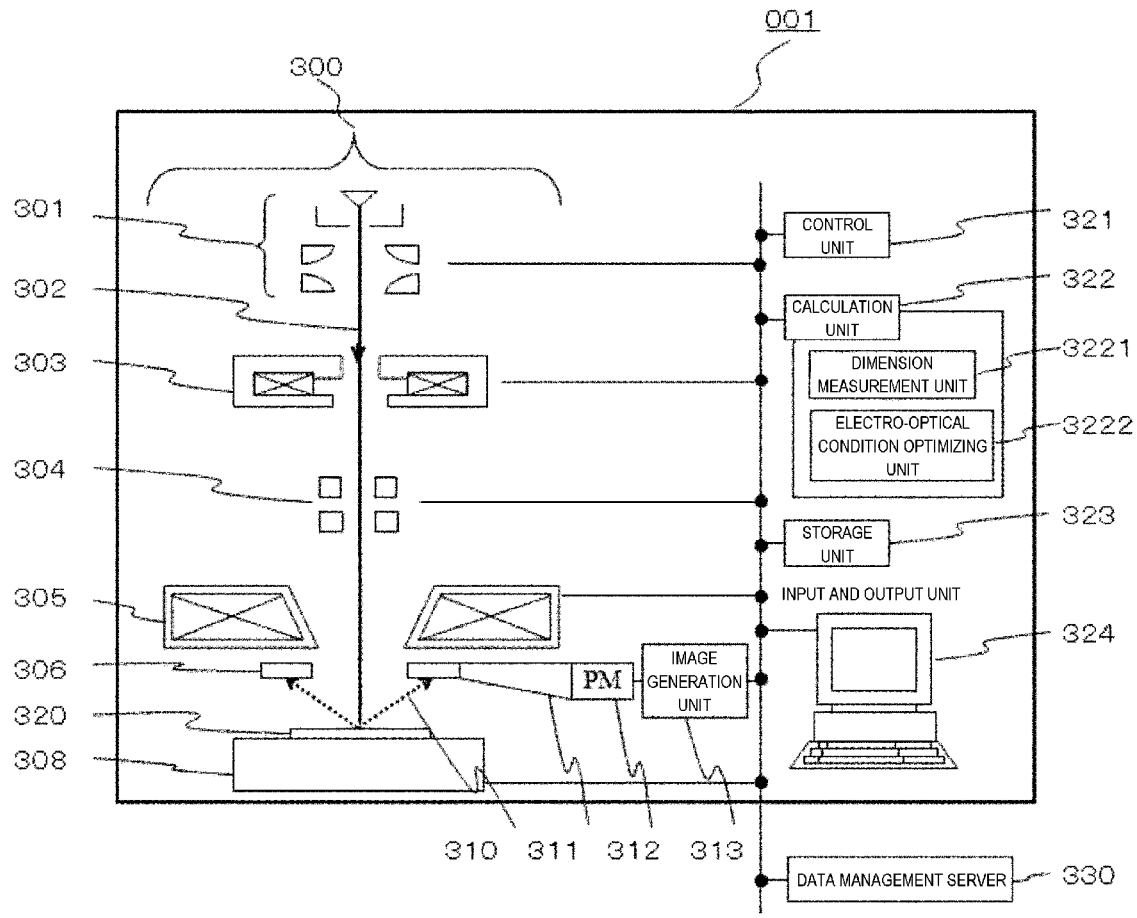
[FIG. 3B]
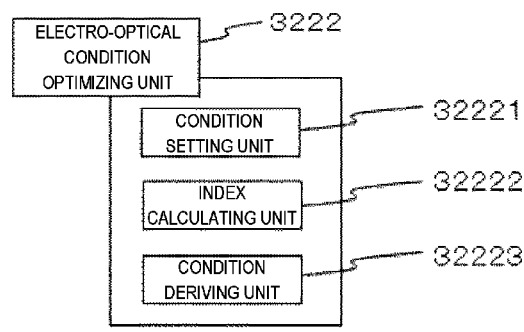

[FIG. 4]
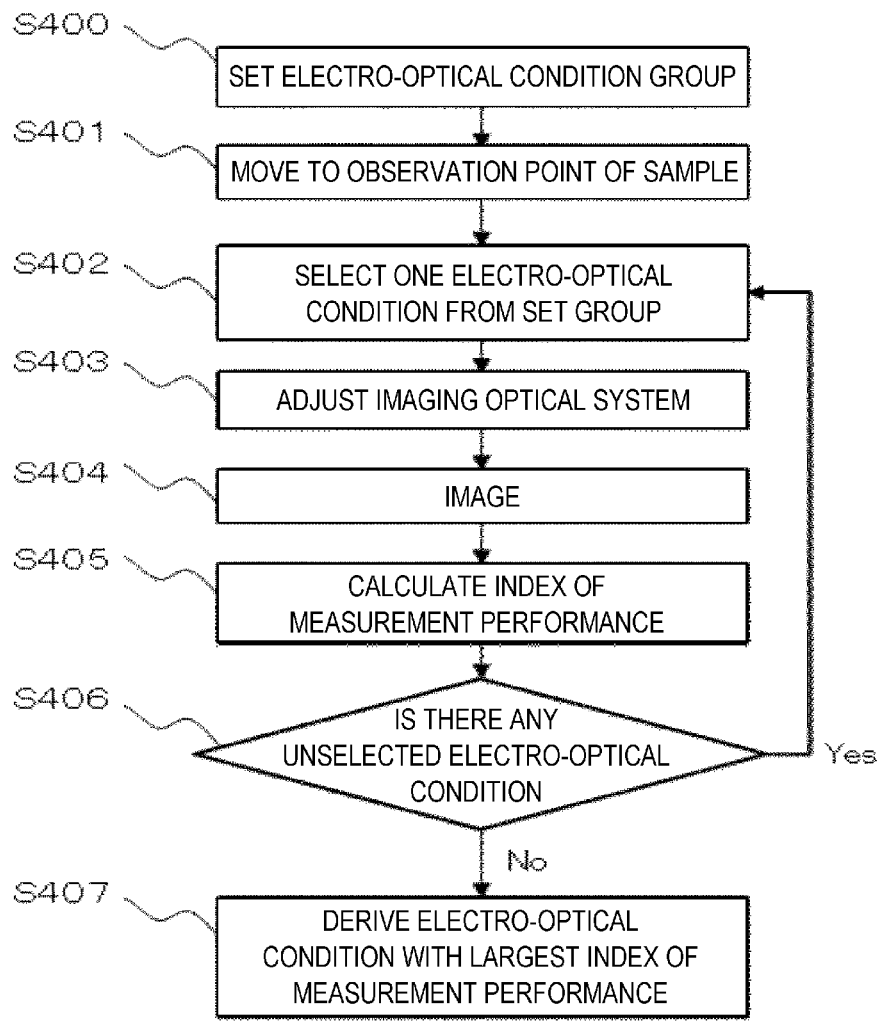

[FIG. 5]
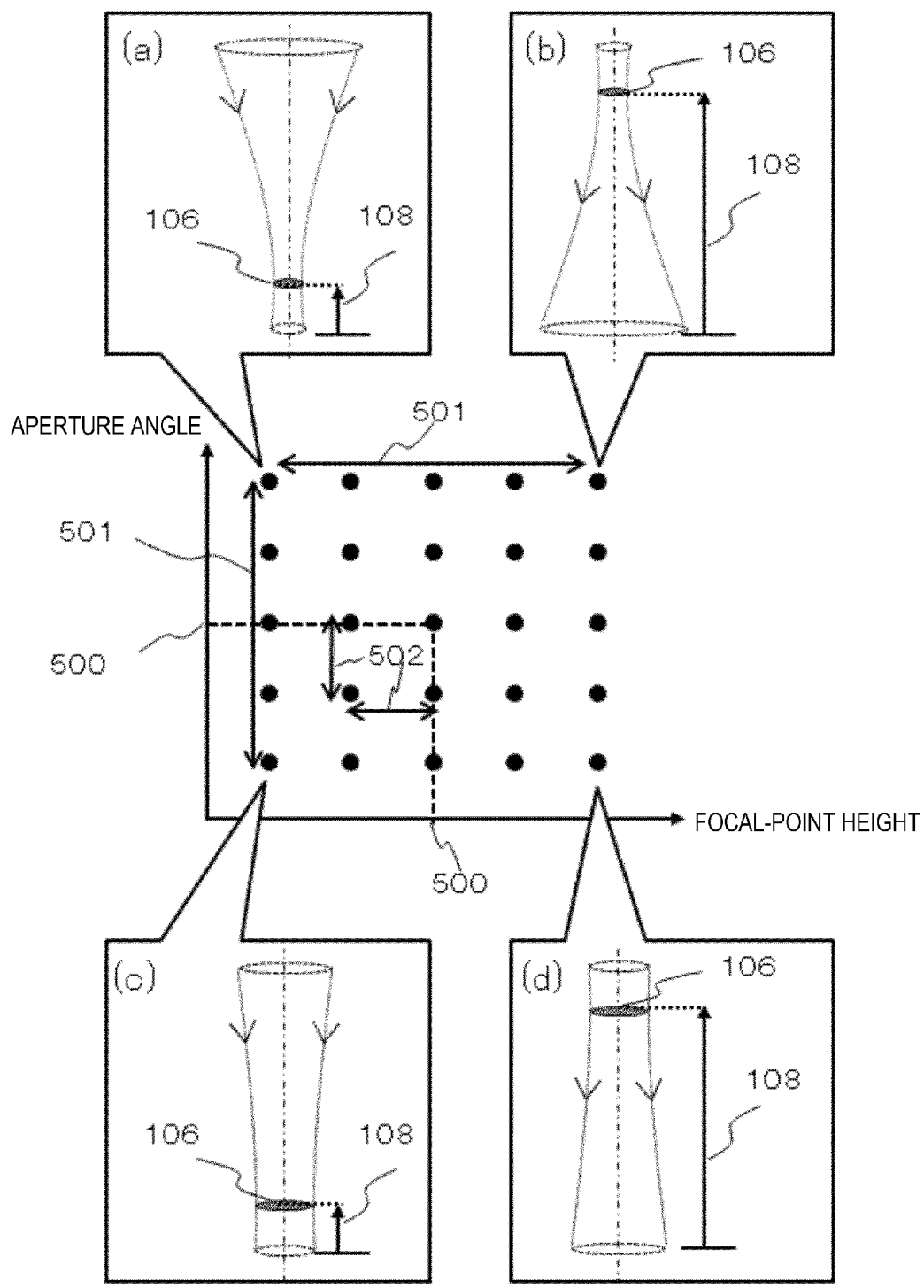

[FIG. 6A]
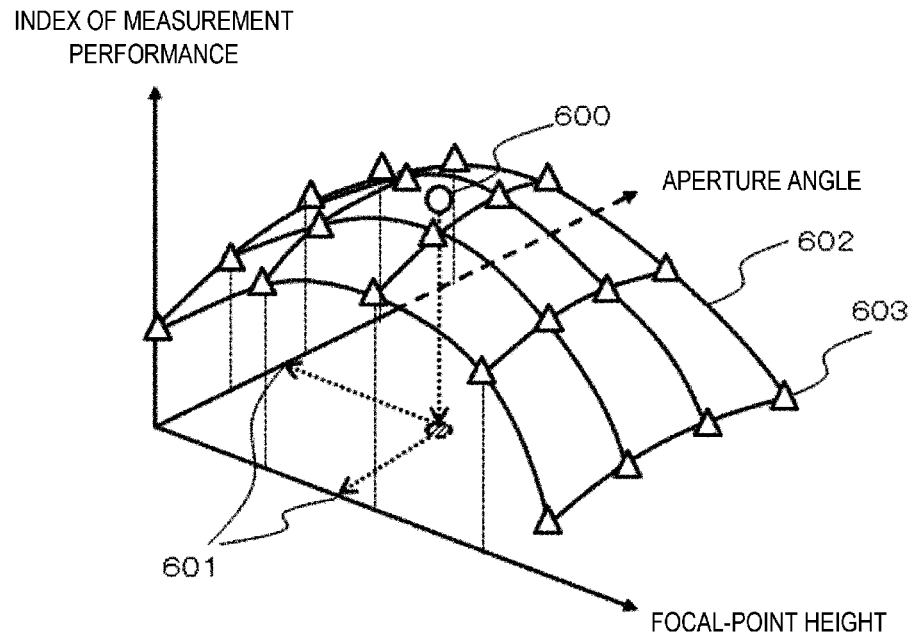
[FIG. 6B]
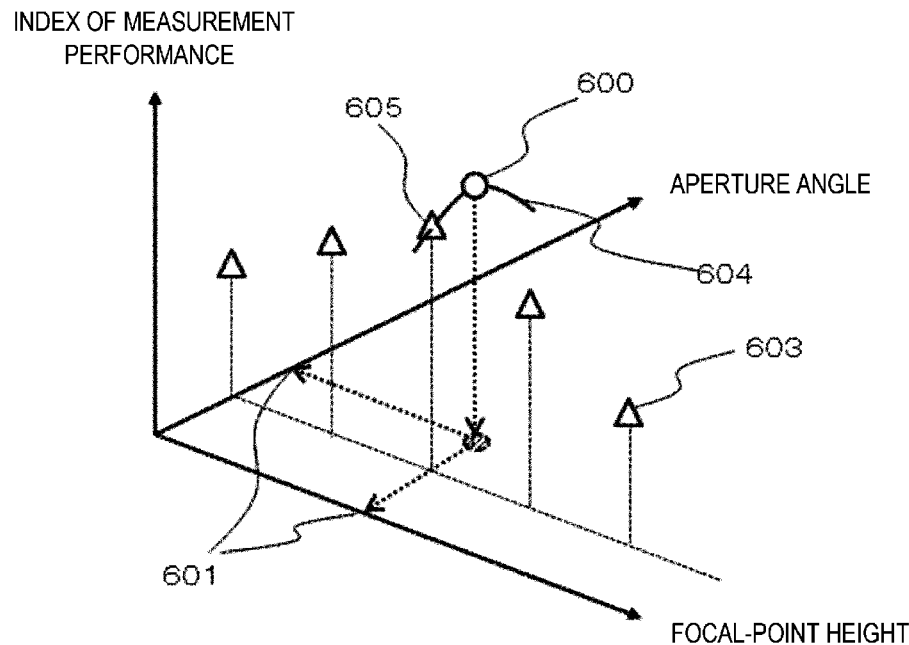

[FIG. 7]
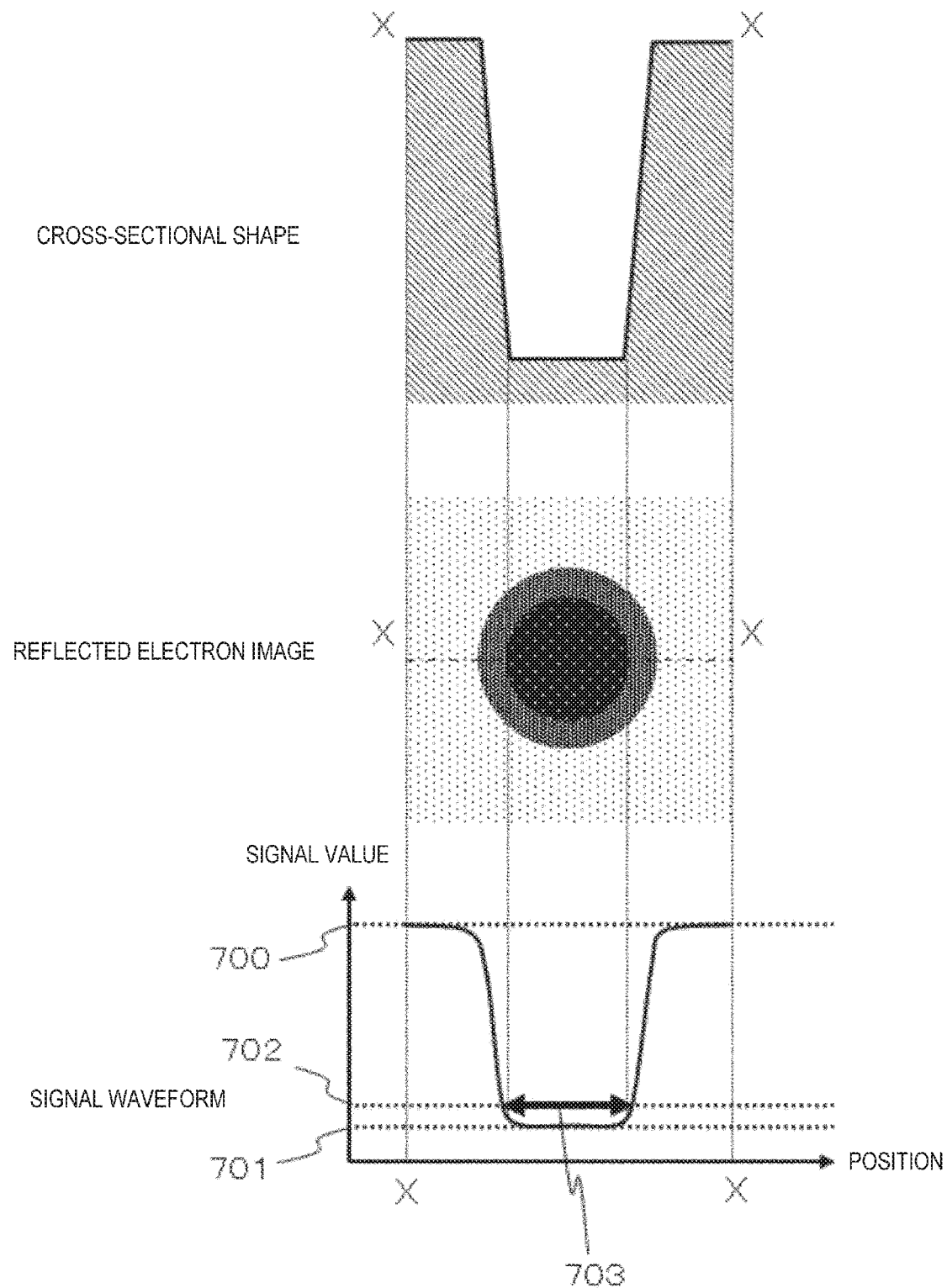

[FIG. 8]
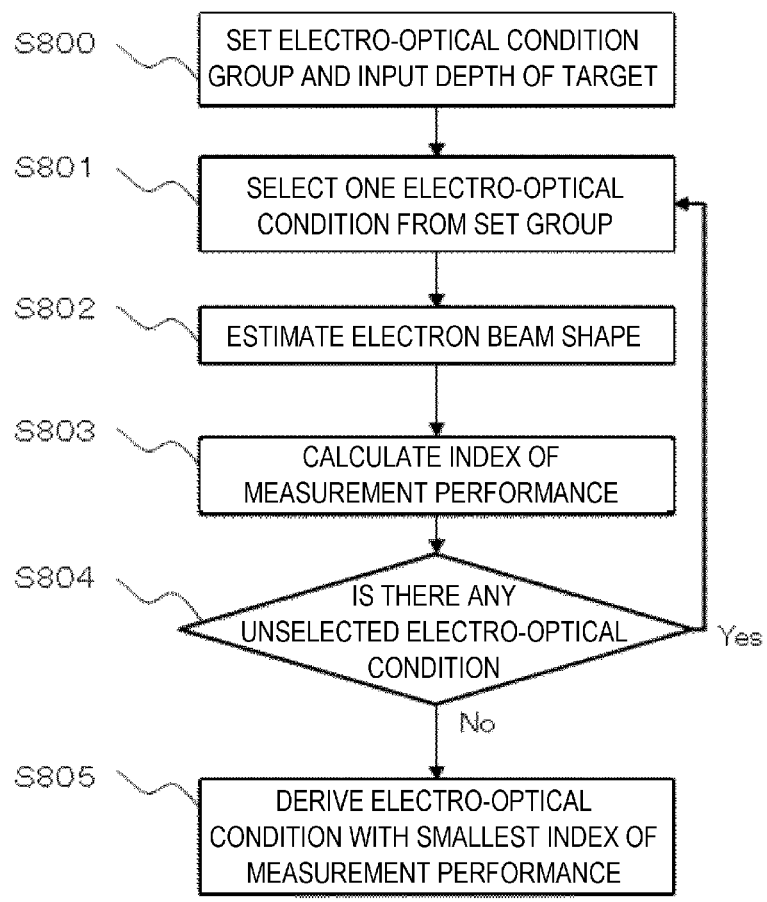

[FIG. 9]
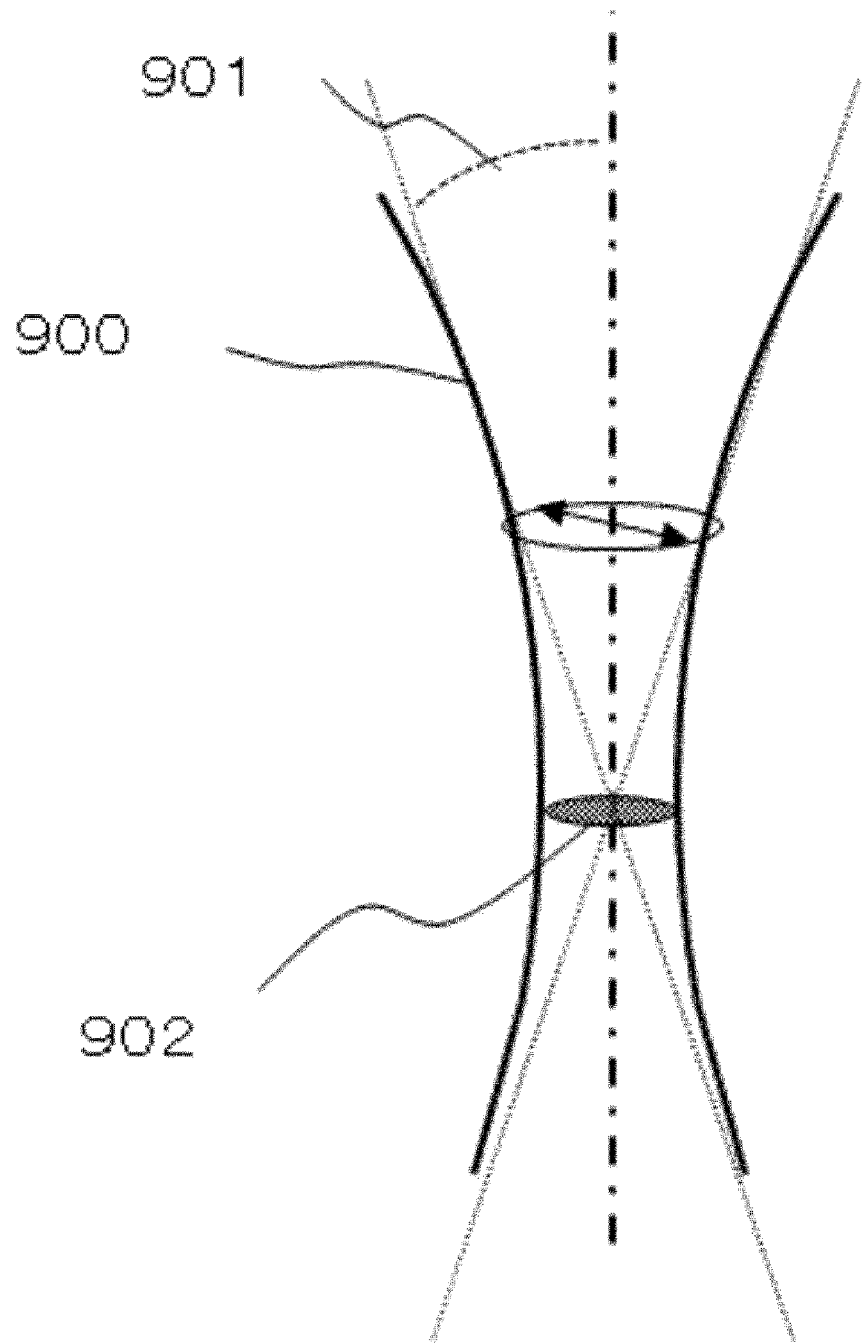

[FIG. 10A]
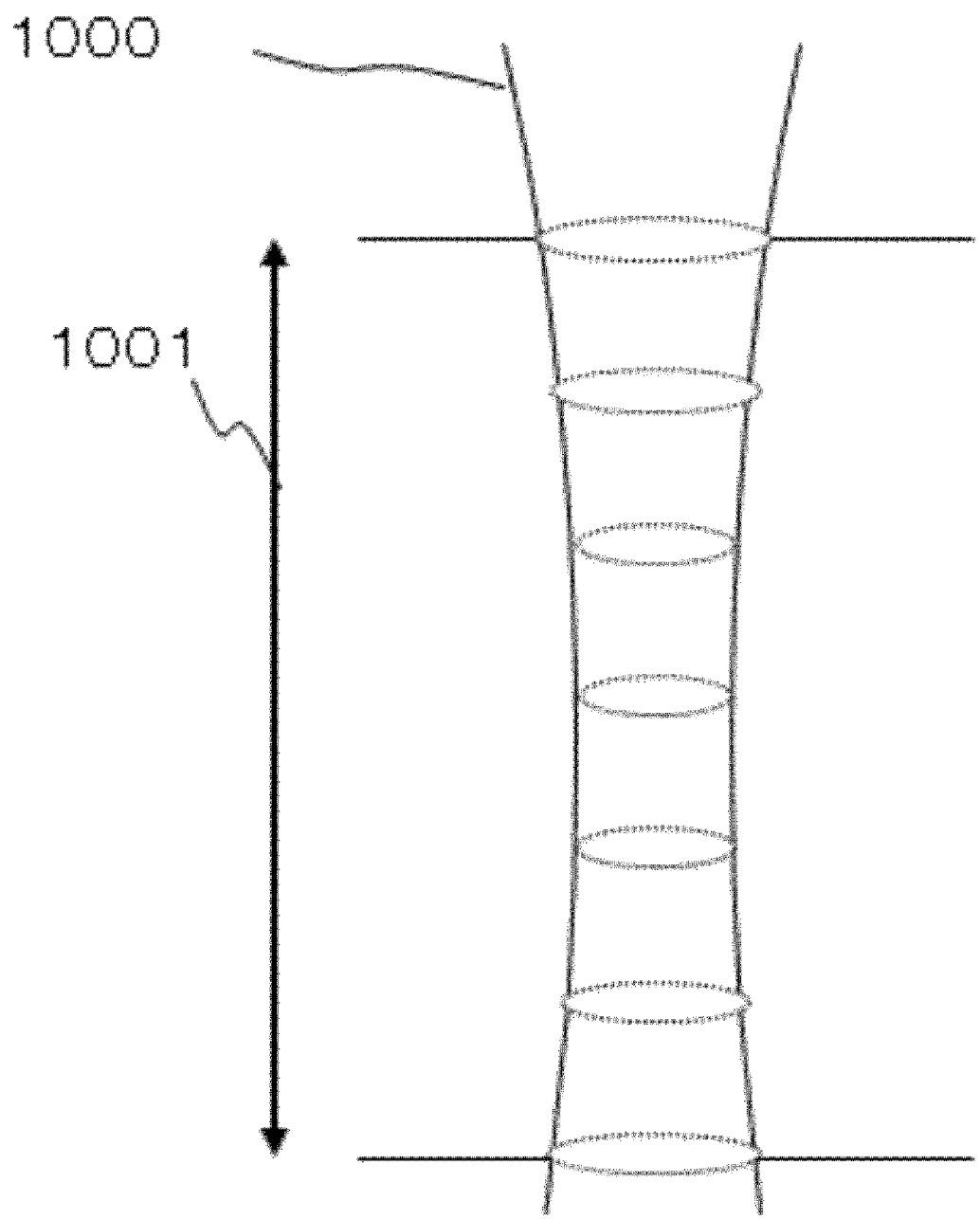

[FIG 10B]
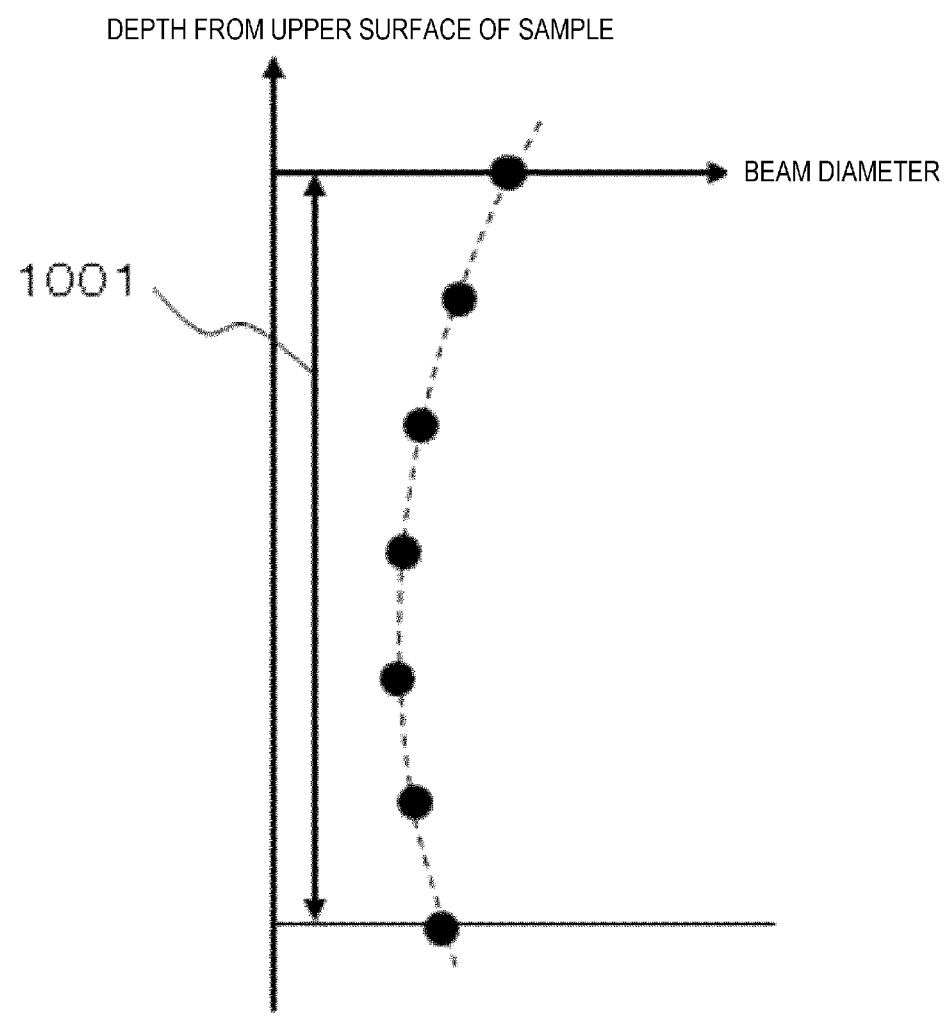

[FIG. 11]

| SET ELECTRO-OPTICAL CONDITION | | | |
|---|---|---|---|
| FULLY AUTOMATIC SETTING MODE ▷ | | | |
| MANUAL INPUT | REFERENCE VALUE | SWING WIDTH | STEP WIDTH |
| ACCELERATING VOLTAGE | | | |
| PROBE CURRENT | | | |
| APERTURE ANGLE | | | |
| FOCAL-POINT HEIGHT | | | |
| PRESET READING | | | |

[FIG. 12]

| INPUT MEASUREMENT TARGET INFORMATION | |
|---|---|
| MANUAL INPUT | |
| DEPTH TO MEASUREMENT TARGET | |
| DATA READING | |

ELECTRONIC MICROSCOPE DEVICE

TECHNICAL FIELD

The present invention relates to an electronic microscope device.

BACKGROUND ART

In a manufacture of a semiconductor device, workmanship of a pattern formed on a wafer is managed between several processes of a plurality of manufacturing processes. A measurement value of a dimension of the pattern formed on the wafer is used as an index of the workmanship, and a scanning electron microscope is widely used for measuring the dimension of the pattern.

When dimension measurement is performed by using the scanning electron microscope, it is necessary to capture an image under an electro-optical condition with the best measurement resolution. Therefore, the electro-optical condition during imaging is adjusted such that a diameter of an electron beam emitted on the pattern is the smallest. In the dimension measurement between the same processes, the same electro-optical condition is applied in order to make dimensional measurement conditions uniform.

At this time, by using an automatic focusing function, a pattern on an upper surface of a sample can be imaged under a condition with a good measurement resolution.

However, when a measurement target is a diameter of a hole bottom of a hole pattern, focusing cannot be performed on the hole bottom by the automatic focusing function.

Therefore, in PTL 1, focusing is performed on a surface of a measurement target by adding an offset, which is registered in advance according to the measurement target, to a focal-point height after automatic focusing. By using this method, when the diameter of the hole bottom is measured, it is possible to irradiate the hole bottom with a beam whose focal-point height is adjusted to a surface of the hole bottom.

CITATION LIST

Patent Literature

PTL 1: JP-A-5-236348

SUMMARY OF INVENTION

Technical Problem

On the other hand, for semiconductor devices in recent years, the development of highly stacked three-dimensional structure devices is progressing, as represented by 3D-NAND devices. In a highly stacked semiconductor device, a depth of a hole or groove to be observed may be the same as or larger than a depth of field (DOF) of an electron beam. At this time, a beam diameter of the electron beam is increased at an accelerating rate as the electron beam goes out of a range of the DOF. Therefore, for a deep hole, when the focal-point height of the electron beam is set to a hole bottom surface, the beam diameter at the upper surface becomes large. This influence becomes more remarkable as the measurement target is deeper.

As a result, in the captured image, a large amount of signals on the upper surface are included near a contour of the hole bottom, and when a hole bottom dimension is measured using the captured image, the measurement resolution decreases.

PTL 1 does not consider such a problem that the measurement resolution decreases as a result of the captured image including a large amount of signals on the upper surface near the contour of the hole bottom. This problem is a new problem caused by high stacking of devices.

An object of the invention is to prevent a decrease in a measurement resolution caused by high stacking of devices in an electronic microscope device.

Solution to Problem

An electronic microscope device according to one aspect of the invention includes: an imaging optical unit configured to irradiate a sample having a step with an electron beam, detect a reflected electron generated from the sample, and convert the reflected electron into an electric signal; an image generation unit configured to generate an image using the electric signal converted by the imaging optical unit; a dimension measurement unit configured to process the image generated by the image generation unit to measure a dimension of a lower surface of the sample; an electro-optical condition generation unit configured to generate, from a plurality of electro-optical conditions, an electro-optical condition under which a prescribed measurement performance is obtained by using a relationship between each electro-optical condition and an index of a measurement performance; a storage unit that stores the electro-optical condition generated by the electro-optical condition generation unit; and a control unit configured to adjust, when the sample is irradiated with the electron beam, the electron beam by reading out the electro-optical condition from the storage unit. The electro-optical condition generation unit includes: a condition setting unit configured to set, as a plurality of the electro-optical conditions, a plurality of electro-optical conditions in which combinations of an aperture angle and a focal-point height for the electron beam are different; an index calculating unit configured to determine an index of the measurement performance in the electro-optical conditions set by the condition setting unit; and a condition deriving unit configured to derive the electro-optical conditions including the aperture angle and the focal-point height, such that the index of the measurement performance determined by the index calculating unit becomes a prescribed value.

Advantageous Effect

According to one aspect of the invention, it is possible to prevent a decrease in a measurement resolution caused by high stacking of devices in an electronic microscope device.

BRIEF DESCRIPTION OF DRAWINGS

FIG. 1A is a schematic diagram showing a trajectory of an electron beam with which a sample is irradiated in a scanning electron microscope.

FIG. 1B is a schematic diagram showing a shape of an electron beam with which a pattern formed on a surface of a sample is irradiated.

FIG. 2A is a schematic diagram showing an irradiation range of an electron beam in which a hole shallower than a DOF of the electron beam is taken as a target and the electron beam is emitted on a hole bottom contour with a focal-point height of the electron beam being adjusted to a hole bottom surface.

FIG. 2B is a schematic diagram showing an irradiation range of an electron beam in which a hole deeper than a DOF of the electron beam is taken as a target and the electron beam is emitted on a hole bottom contour with a focal-point height of the electron beam being adjusted to a hole bottom surface.

FIG. 2C is a schematic diagram showing an irradiation range of an electron beam in which a hole deeper than a DOF of the electron beam is taken as a target, and the electron beam is emitted on a hole bottom contour with an aperture angle of the electron beam larger than that in FIG. 2B and a focal-point height set to a middle height of the hole.

FIG. 3A is a block diagram showing a configuration of a scanning electron microscope system.

FIG. 3B is a block diagram showing a configuration of an electro-optical condition optimizing unit in the scanning electron microscope system.

FIG. 4 is a flowchart showing processing from setting of an electro-optical condition to derivation of an optimum condition in Embodiment 1.

FIG. 5 is a schematic diagram showing a plurality of electro-optical conditions in which an aperture angle and a focal-point height, which are created by setting an electro-optical condition, are combined, and corresponding electron beam shapes.

FIG. 6A is a schematic diagram showing a graph showing an index of a measurement performance in a plurality of combinations of the aperture angle and the focal-point height, and derivation of an optimum value by curved surface fitting.

FIG. 6B is a schematic diagram showing a graph showing an index of a measurement performance with respect to a focal-point height, and derivation of an optimum value by extrapolation using a model expression showing a relationship between an aperture angle and the index of the measurement performance.

FIG. 7 is a diagram showing an example of a method for measuring a diameter of a hole bottom using an image captured with a deep hole as a target.

FIG. 8 is a flowchart showing processing from setting of an electro-optical condition to derivation of an optimum condition in Embodiment 2.

FIG. 9 is a schematic diagram of a beam shape expressed by an aperture angle and a minimum beam diameter, assuming that the electron beam shape is a hyperbolic model.

FIG. 10A is a schematic diagram showing an electron beam shape at a depth from an upper surface of a sample to a measurement target.

FIG. 10B is a schematic diagram of a graph showing a transition of an electron beam diameter at the depth from the upper surface of the sample to the measurement target.

FIG. 11 is an explanatory diagram of a screen display for setting electro-optical conditions.

FIG. 12 is an explanatory diagram of a screen display for inputting measurement target information.

DESCRIPTION OF EMBODIMENTS

An embodiment relates to a method for optimizing an electro-optical condition under which a sample having a step that is the same as or larger than a DOF of an electron beam is used as a target and a dimension of a lower surface of the sample having the step is measured.

FIG. 1A is a schematic diagram showing a trajectory of an electron beam 100 with which a sample is irradiated in a scanning electron microscope. As shown in FIG. 1A, an electron beam generated from an electron gun 101 passes through a lens group 102 and is focused on a sample 103.

FIG. 1B is a schematic diagram showing a shape of an electron beam with which a pattern 104 formed on a surface of the sample 103 is irradiated. As shown in FIG. 1B, the electron beam 100 has a beam diameter that changes in a height direction along an optical axis, and has a range (hereinafter referred to as a DOF) 110 that can be regarded as a minimum beam diameter near a focal-point height 108. Therefore, in order to minimize a beam diameter 107 emitted on a surface of the pattern 104, it is necessary to minimize a minimum beam diameter 106 of the electron beam and adjust a height 109 of the pattern surface within the range of the DOF 110.

The minimum beam diameter 106 of the electron beam is mainly determined by an aperture angle 104 of the electron beam, an accelerating voltage of the electron gun, and a probe current value. Of these, since the accelerating voltage is related to a penetration length of electrons emitted into the sample, the accelerating voltage is generally set according to a structure and material of a pattern to be measured.

Further, the probe current value is often set to a value as large as possible for the purpose of improving a signal-to-noise ratio of a captured image. Further, the aperture angle of the electron beam with which the minimum beam diameter is the smallest is uniquely determined by a trade-off between diffraction aberration and spherical aberration based on a configuration of an electron optical system. That is, these electro-optical conditions are often operated as fixed parameters of a device.

On the other hand, it is necessary to adjust the focal-point height 107 at which the electron beam becomes the minimum to a height of the pattern to be measured at the time of image capturing. Therefore, automatic focusing is performed, images captured under a plurality of different focal-point conditions are analyzed, and the focal-point height is adjusted to a condition under which a high-frequency component is the strongest. The condition under which the high-frequency component is the strongest often means that an edge portion of an upper surface of the sample where a signal change is large is in focus.

Therefore, if an automatic focusing function is used, a pattern on the upper surface of the sample can be imaged under a condition with a good measurement resolution. However, when a measurement target is a hole bottom diameter of a hole pattern, focusing cannot be performed on the hole bottom by the automatic focusing function.

In particular, for semiconductor devices in recent years, the development of highly stacked three-dimensional structure devices is progressing, as represented by 3D-NAND devices. In a highly stacked semiconductor device, a depth of a hole or groove to be observed may be the same as or larger than a DOF of an electron beam. For example, a DOF of an electron beam with an accelerating voltage of 15 kV and a depth of a channel hole in a 3D-NAND device are both on the order of microns.

The beam diameter of the electron beam is increased at an accelerating rate as the electron beam goes out of the range of the DOF. Therefore, for the deep hole, when the focal-point height of the electron beam is set to a hole bottom surface, the beam diameter at the upper surface becomes large. This influence becomes more remarkable as the measurement target is deeper.

FIG. 2A is a schematic diagram showing a beam shape in which a hole pattern shallower than the DOF of the electron beam is taken as a target and the minimum beam diameter of the electron beam 200 is adjusted to the hole bottom. Here, the upper part of FIG. 2A shows a cross section of the beam shape, and the lower part shows an upper surface of the beam shape. Under this condition, the irradiation range of the electron beam is concentrated on a contour of the hole bottom, and the increase of the beam diameter on the upper surface causes almost no problem.

On the other hand, FIG. 2B is a schematic diagram showing a beam shape in which a hole pattern that is as deep as the DOF of the electron beam is taken as a target and the minimum beam diameter of the electron beam 200 is adjusted to the hole bottom. Here, the upper part of FIG. 2B shows a cross section of the beam shape, and the lower part shows an upper surface of the beam shape. Under this condition, most of the electron beam that is supposed to be emitted on the lower surface is emitted on the upper surface.

For example, it is assumed that the beam spreads linearly with an aperture angle of 10 mrad and a depth of a target hole is 4 microns, a radius of the beam diameter at the upper surface is 40 nm larger than that of the beam diameter at the hole bottom surface. For this reason, the minimum beam diameter of a scanning electron microscope for dimension measurement is generally on the order of several nanometers.

As a result, in the captured image, a large amount of signals on the upper surface are included near the contour of the hole bottom. When a hole bottom dimension is measured using the captured image, the measurement resolution decreases. It can be said that the above problem is a new measurement problem caused by high stacking of devices.

The embodiment provides an electronic microscope device capable of preventing a decrease in the measurement resolution caused by the high stacking of the devices.

As a method of solving this problem, it is conceivable to intentionally shift the focal-point height upward from the height of the pattern to be measured and to intentionally reduce the aperture angle of the electron beam. The beam diameter on the upper surface can be reduced by shifting the focal-point height upward. However, when the focal-point height is excessively away from the pattern to be measured, the beam diameter emitted to the pattern to be measured increases, and thus the measurement resolution decreases.

On the other hand, the increase of the electron beam on the upper surface can also be reduced by reducing the aperture angle of the electron beam and increasing the DOF. However, when the DOF is made deep, the minimum beam diameter becomes large due to the influence of the diffraction aberration. Therefore, when the aperture angle is made excessively small, the measurement resolution also decreases. Therefore, in order to improve the measurement resolution, it is necessary to calculate an optimum combination condition of the focal point height and the aperture angle.

In the embodiment, a pattern formed on a wafer is taken as a target, and a combination of a focal-point height and an aperture angle under which an index, which is a dimension measurement performance of a lower surface, for example, measurement resolution and measurement reproducibility, is the best is derived from a plurality of electro-optical conditions with different combinations of the aperture angle and the focal-point height. Then, in the dimension measurement during the same process, a dimension of the lower surface is measured using the image captured under this derived combination condition.

FIG. 2C shows an example of an electro-optical condition that can be implemented according to the embodiment. Here, the upper part of FIG. 2C shows a cross section of the beam shape, and the lower part shows an upper surface of the beam shape. In FIG. 2C, a hole pattern that is as deep as the DOF of the electron beam is taken as a target, the aperture angle is set to be relatively large, and the focal-point height is set to a middle height of the hole. Accordingly, as compared with the condition in FIG. 2B, the minimum beam diameter increases as much as the aperture angle increases, but the range of the electron beam emitted on the upper surface can be reduced.

According to the embodiment, it is possible to improve the measurement performance such as the measurement resolution and the measurement reproducibility when the dimension of the lower surface of the sample having the step is measured.

Hereinafter, modes for implementing the embodiment will be described with reference to the drawings.

Embodiment 1

In Embodiment 1, a case will be described in which a pattern whose depth is unknown is taken as a measurement target. An optimum electro-optical condition is determined by obtaining images of a plurality of electro-optical conditions and comparing indexes of measurement performances obtained from the images.

An example of a basic configuration of a scanning electron microscope system (electronic microscope device) according to Embodiment 1 will be described with reference to FIG. 3A.

As shown in FIG. 3A, a scanning electron microscope system 001 includes an imaging optical system (imaging optical unit) 300, a control unit 321, a calculation unit 322, a storage unit 323, and an input and output unit 324.

The imaging optical system 300 includes a stage 308, an image generation unit 313, and an electron optical system including an electron gun 301, a condenser lens 303, a deflector 304, an objective lens 305, an annular scintillator 306, an optical fiber 311, and a photo multiplier (PM) 312.

The electron gun 301 generates a primary electron beam (electron beam) 302. The condenser lens 303 and the objective lens 305 focus the primary electron beam 302 on a surface of a sample 320. The deflector 304 two-dimensionally scans the sample 320 with the primary electron beam 302. The annular scintillator 306 receives reflected electrons 310 emitted from the sample 320 and converts the reflected electrons 310 into an optical signal. The optical fiber 311 guides the optical signal to the photo multiplier 312. The photo multiplier 312 converts the optical signal into an electric signal and multiplies the electric signal. The image generation unit 313 generates a digital image using the multiplied signal. The stage 308 moves the sample 320, so that an image of any position on the sample 320 can be captured.

The control unit 321 controls a voltage applied to the periphery of the electron gun 301, focal-point height adjustment of the condenser lens 303 and the objective lens 305, a movement of the stage 308, an operation timing of the image generation unit 313, and the like.

The calculation unit 322 includes a dimension measurement unit 3211 and an electro-optical condition optimizing unit (also referred to as an electro-optical condition generation unit) 3222. The dimension measurement unit 3211 processes a captured image generated by the image generation unit 313 to perform dimension measurement processing. The electro-optical condition optimizing unit 3222 derives, by using a dimension measurement processing result, an image evaluation value, or simulation data, the optimum electro-optical condition when an image for dimension measurement is captured.

The storage unit 323 stores the captured image generated by the image generation unit 313, an electro-optical condition from the input and output unit 324 input by a user, a dimension measurement condition, and the like. The input and output unit 324 includes a display screen, and displays input of the electro-optical condition, input of the dimension measurement condition, and a dimension measurement result on the display screen.

As described above, the scanning electron microscope system (scanning electron microscope) 001 of Embodiment 1 includes: the imaging optical system (imaging optical unit) 301 that irradiates the sample 320 having a step with the primary electron beam (electron beam) 302, detects the reflected electrons generated from the sample 320, and converts the reflected electrons into the electric signal; the image generation unit 313 that generates an image using the electric signal converted by the imaging optical unit 301; the dimension measurement unit 3221 that processes the image generated by the image generation unit 313 to measure a dimension of a lower surface of the sample 320; the electro-optical condition optimizing unit (electro-optical condition generation unit) 3222 that generates, from the plurality of electro-optical conditions, the electro-optical condition under which an optimum measurement performance can be obtained by using a relationship between each electro-optical condition and the index of the measurement performance; the storage unit 323 that stores the electro-optical condition derived from the electro-optical condition optimizing unit 3222; and the control unit 321 that adjusts, when the sample 320 is irradiated with the electron beam 302, the electron beam 302 by reading out the electro-optical condition from the storage unit 323.

Here, the storage unit 323 stores a plurality of electro-optical conditions in which combinations of an aperture angle and a focal-point height of the electron beam 302 are different.

A condition setting unit 32221 reads out the electro-optical conditions stored in the storage unit 323 to set an electro-optical condition based on condition group information for optimizing the electro-optical condition received from the input and output unit 324.

The dimension measurement unit 3221 processes the image generated by the image generation unit 313 using the electro-optical conditions stored in the storage unit 323 in the same manufacturing process among a plurality of manufacturing processes, and then measures the dimension of the lower surface of the sample 320.

Next, a configuration of the electro-optical condition optimizing unit 3222 will be described with reference to FIG. 3B.

As shown in FIG. 3B, the electro-optical condition optimizing unit 3222 includes: the condition setting unit 32221 that sets, as a plurality of electro-optical conditions, a plurality of electro-optical conditions in which the combinations of the aperture angle and the focal-point height of the electron beam 302 are different; an index calculating unit 32222 that determines the index of the measurement performance in the electro-optical conditions set by the condition setting unit 32221; and a condition deriving unit 32223 that derives an electro-optical condition including an aperture angle and a focal-point height, such that the index of the measurement performance determined by the index calculating unit 32222 becomes a prescribed value (ideal value).

Next, with reference to a flowchart in FIG. 4, a flow from the input of the electro-optical conditions to the derivation of the optimum electro-optical condition in Embodiment 1 will be described.

First, after the input and output unit 324 receives an instruction for optimizing the electro-optical condition from the user, the calculation unit 322 sets an electro-optical condition group which can be implemented by the imaging optical system 300 and in which a combination of values such as the aperture angle and the focal-point height of the electron beam 302, the accelerating voltage, and the probe current value is changed (S400).

Here, FIG. 5 shows examples (a) to (d) of electron beam shapes under the plurality of electro-optical conditions in which combinations of the values of the aperture angle and the focal-point height are changed.

(a) and (b) are electron beam shapes under a condition that the aperture angle is larger and the minimum beam diameter 106 is smaller than those in (c) and (d). (a) and (c) are electron beam shapes under a condition that the focal-point height 108 is lower than that in (b) and (d).

Input related to a setting range of the electro-optical condition may be received from the user via the input and output unit 324, and the calculation unit 322 may set a plurality of electro-optical condition groups based on the input information.

The input information is, for example, a reference value 500, a change width 501, and a step width 502 under each condition. Alternatively, the plurality of combined electro-optical condition groups shown in FIG. 4 are registered in advance by the user in the storage unit 323 of the scanning electron microscope system 001 or a data management server 330 connected to the network. Then, the input and output unit 324 may receive a specification of the groups from the user, and read and set information on the registered electro-optical condition groups.

Next, the control unit 321 moves a field of view to a target position (S401), and selects an electro-optical condition from the set electro-optical condition group (S402). The imaging optical system 300 is adjusted to match the electro-optical condition (S403). Specifically, adjustment and the like of the focal-point height and the aperture angle is performed by adjusting an excitation current of an electromagnetic lens. The imaging optical system 300 images the sample 320 under the adjusted electro-optical condition (S404).

The electro-optical condition optimizing unit 3222 calculates the index of the measurement performance by using the obtained captured image (S405). The index of the measurement performance will be described later.

Next, if there is an electro-optical condition that is not yet selected from the set electro-optical condition group in S400, the electro-optical condition is selected and the processing returns to S402. When all the set electro-optical conditions are selected and imaging is completed, the processing proceeds to next step (S406).

By performing this series of processing (S402 to S405) for all the electro-optical conditions set in S400, the relationship between each electro-optical condition and the index of the measurement performance is calculated.

The electro-optical condition optimizing unit 3222 derives an electro-optical condition under which the index of the measurement performance is the ideal value based on the obtained relationship between the electro-optical condition and the index of the measurement performance (S407). For example, the condition deriving unit 32223 derives, as the electro-optical condition under which the index of the measurement performance is the prescribed value (ideal value), an electro-optical condition under which the index of the measurement performance is largest based on the relationship between the plurality of electro-optical conditions and the index of the measurement performance.

For example, FIG. 6A shows an example of a graph of the measurement performance with respect to a plurality of combinations of the aperture angle and the focal-point height, which are part of the electro-optical condition. A maximum value 600 is obtained by applying a polynomial surface 602 such as a quadratic function to a plurality of sample points 603 in this graph. An electro-optical condition 601 or the like at the maximum value 600 is derived as an optimum condition.

Alternatively, a relationship between a specific electro-optical condition and the measurement performance is registered in advance as data or a model expression in the storage unit 323 of the scanning electron microscope system 001 or the data management server 330 connected to the network. Then, the optimum condition may be derived by interpolating the relationship between the electro-optical condition and the index of the measurement performance obtained in S402 to S405 using the data or the model expression.

For example, FIG. 6B shows a graph of the index of the measurement performance when only the focal-point height is changed. Among the sample points 603 of this graph, a sample point 605 at which the index of the measurement performance is the largest is obtained. The maximum value 600 may be obtained by applying and extrapolating the data or the model expression showing the pre-registered relationship between the aperture angle and the index of the measurement performance to the sample point 605. At this time, the index of the measurement performance with respect to the focal-point height and the index of the measurement performance with respect to the aperture angle may be different.

The above is a processing flow from the input of the electro-optical condition to the derivation of the optimum electro-optical condition. The derived electro-optical condition is registered in the storage unit 323 or the data management server 330 connected to the network. Then, for a pattern of the same design as the measurement target to which the derived condition is applied, the registered condition is used to image the pattern and a dimension is measured. Accordingly, the measurement performance can be improved.

Hereinafter, an example of the index of the measurement performance in S405 will be described. Several indexes can be considered and it is necessary to use the indexes according to the purpose.

First, a case where a dimension measurement value of the lower surface of the sample 320 is used as an index will be described. That is, the index calculating unit 32222 uses, as the index of the measurement performance, the dimension of the lower surface of the sample 320 measured by the dimension measurement unit 3221.

FIG. 7 shows an example of a method for measuring a diameter of a hole bottom by using a reflected electron image obtained by imaging a deep hole shown in the cross-sectional view. When a target material is homogeneous, a signal waveform of the reflected electron image tends to be smaller at a deeper portion.

Therefore, a hole bottom diameter 703 can be measured by detecting a position of a signal that internally divides between a maximum value 700 and a minimum value 701 of the signal waveform using an appropriate small threshold value 702 (for example, 5%). The larger the irradiation range of the electron beam 302 with respect to the hole bottom contour, the more blurred the signal waveform near the hole bottom contour and the larger the signal value. Therefore, a measurement value of the hole bottom diameter tends to be small. That is, if the measurement value of the hole bottom diameter is used as an index, it is possible to evaluate whether a beam focused on the hole bottom contour can be emitted. It can be said that the electro-optical condition in which the index is the largest is a condition under which the measurement value closest to a true value of the hole bottom diameter is obtained.

Alternatively, a variation range of the measurement value of the hole bottom diameter within a variation range of the focal-point height based on an adjustment accuracy of an automatic focusing function of a device may be used as an index. It can be said that the electro-optical condition under which the index is the smallest is a condition under which the measurement value is stable with respect to variations in the focal-point height. In other words, it can be said that the condition has good measurement reproducibility.

Next, a case where both the dimension of the lower surface and the dimension of the upper surface are used will be described. That is, the dimension measurement unit 3221 measures the dimension of the upper surface of the sample 320, and the index calculating unit 32222 uses, as the index of the measurement performance, a difference between the dimension of the lower surface and the dimension of the upper surface of the sample 320 measured by the dimension measurement unit 3221.

For example, as shown in FIG. 7, a diameter of an opening on an upper surface of the hole can be obtained by setting the threshold value 702 during the dimension measurement of the hole bottom to an appropriately large value (for example, 90%). The larger the irradiation range of the electron beam with respect to a contour of the opening, the more blurred the signal waveform near the contour of the opening and the smaller the signal value. Therefore, the measurement value of the opening diameter tends to be large. Therefore, a difference between the measurement values of the hole bottom diameter and the opening diameter is an index that comprehensively evaluates a blur amount of the upper surface and the lower surface. It can be said that the electro-optical condition under which the index becomes zero is a condition under which measurement resolutions at both dimensions of the upper surface of the sample 320 and the lower surface of the sample 320 are satisfied.

Alternatively, a sum of dimension change amounts with respect to a change in the focal-point height of the hole bottom diameter and the opening diameter may be used as an index. It can be said that the condition under which the index is the smallest is a condition under which both measurement values are stable with respect to variations in the focal-point height and both measurement reproducibility are satisfied.

Finally, a case where an index related to an appearance of an image is used instead of the measurement value will be described. For example, as an index showing sharpness of an image, a sum of squares of differences between each pixel in the image and an adjacent pixel thereof is used as the index. That is, the index calculating unit 32222 uses sharpness of the image generated by the image generation unit 313 as the index of the measurement performance. At this time, the index calculating unit 32222 uses, as the sharpness, the sum of the squares of the differences between each pixel in the image and the adjacent pixel thereof.

The index becomes larger as a signal change in the image becomes steeper. That is, it can be said that the electro-optical condition under which the index is largest is a condition under which a signal change in the contour of the pattern becomes steep and visibility of the pattern is the best.

Any one of the above indexes or a weighted average of the plurality of indexes is used as the index of the measurement performance. According to Embodiment 1, it is possible to derive an electro-optical condition under which an image can be captured with a measurement resolution, measurement reproducibility, or visibility being improved.

Embodiment 2

In Embodiment 2, a case will be described in which a pattern whose depth is known is taken as a measurement target. An electron beam shape (beam diameter, aperture angle, and focal-point height) under each electro-optical condition can be estimated based on a design value of the scanning electron microscope system 001. Therefore, instead of actually obtaining images under the plurality of electro-optical conditions as in Embodiment 1, a condition under which an index of a measurement performance is optimal is obtained by calculation for a target with a known depth.

Since a configuration of a scanning electron microscope system used in Embodiment 2 is the same as that of the scanning electron microscope system 001 shown in FIG. 3A described in Embodiment 1, the description thereof will be omitted.

Next, with reference to a flowchart in FIG. 8, a flow from input of the electro-optical condition to derivation of an optimum electro-optical condition in Embodiment 2 will be described. Here, processing of S801, S804, and S805 in this flow are respectively the same as S402, S406, and S407 in the flow chart of Embodiment 1 in FIG. 3. Therefore, only processing (S800, S802, S803) different from those of Embodiment 1 will be described in detail.

First, the input and output unit 324 receives an instruction for optimizing the electro-optical condition, and the calculation unit 322 sets all electro-optical conditions that can be implemented by the imaging optical system 300. At the same time, in Embodiment 2, input of the depth from the upper surface of the sample 320 to a pattern to be measured is received (S800). The depth may be input by the user, or a design value of the measurement target may be registered in advance in the storage unit 323 of the scanning electron microscope system 001 or the data management server 230 connected to the outside and the design value is read.

Next, the electro-optical condition optimizing unit 3222 selects one of the electro-optical conditions set in S800 (S801), and estimates the electron beam shape corresponding to the selected electro-optical condition.

FIG. 9 is a schematic diagram of a beam shape 903 expressed by an aperture angle 901 and a minimum beam diameter 902, assuming that the beam shape is a hyperbolic model. As described above, an appropriate beam shape model is assumed, and the electron beam shape is analytically estimated based on the electro-optical condition. Alternatively, the electron beam shape may be estimated by performing computer experiments imitating an electron optical system of a scanning electron microscope with the electro-optical condition as input. Alternatively, the beam shape may be obtained by calibration sequences.

Further, beam shape data obtained by the computer experiments or the calibration sequences may be associated with the electro-optical condition and registered in advance in the storage unit 323 of the scanning electron microscope system 001 or the data management server 230 connected to the outside. Then, the beam shape may be estimated by collating with the electro-optical conditions set in S800 and reading the corresponding beam shape data, or by performing linear interpolation, or the like.

Next, the electro-optical condition optimizing unit 3222 calculates the index of the measurement performance using the beam shape estimated in S802 and the depth of the measurement target (S803). FIG. 10A is a schematic diagram showing a beam shape 1000 estimated in S802 in a range of a depth 1001 from the upper surface of the sample 320 to the measurement target. FIG. 10B is a schematic diagram of a graph showing a transition of a beam diameter at this time.

In Embodiment 2, an average value or a maximum value of the beam diameter in the range of the depth 1001 from the upper surface of the sample 320 to the measurement target is used as the index of the measurement performance. The smaller the index is, the smaller the beam diameter emitted on the pattern to be measured is. Therefore, it can be said that the electro-optical condition corresponding to the beam shape under which the index is the smallest is a condition under which the measurement resolution is the best.

That is, the index calculating unit 32222 uses, as the index of the measurement performance, the electron beam diameters from the upper surface of the sample 320 to the depth which are obtained based on the electron beam shape. At this time, the index calculating unit 32222 uses, for example, an average diameter or a maximum diameter of the electron beam 302 as the electron beam diameter.

Alternatively, a difference between the beam diameters of the upper surface and the lower surface of the sample 320 may be used as the index of the measurement performance. That is, the index calculating unit 32222 uses, for example, the difference between the electron beam diameters of the upper surface of the sample 320 and the lower surface of the sample 320 as the index of the measurement performance. It can be said that the condition under which the index becomes zero is a condition under which the beam diameter emitted on the pattern to be measured becomes small.

Further, a change rate of the beam diameter at each depth from the upper surface to the lower surface may be calculated, and an average value or a maximum value of the change rate may be used as an index. It can be said that the condition under which the index is the smallest is a condition under which a change in the beam diameter from the upper surface to the lower surface is small and stable with respect to variations in the focal-point height.

Thereafter, similar to Embodiment 1, this series of processing (S801 to S803) is performed for all the electro-optical conditions set in S800. Accordingly, a relationship between each electro-optical condition and the index of the measurement performance is obtained, and an electro-optical condition under which the index of the measurement performance is the smallest is derived (S805). That is, the condition deriving unit 32223 derives, as the electro-optical condition under which the index of the measurement performance is the prescribed value (ideal value), the electro-optical condition under which the index of the measurement performance is the smallest based on the relationship between the plurality of electro-optical conditions and the index of the measurement performance.

In Embodiment 2, imaging of the measurement target is not necessary since the optimum electro-optical condition is derived. Therefore, as compared with Embodiment 1, there is an advantage that Embodiment 2 can be implemented even if there is no actual pattern to be measured.

Embodiment 3

Embodiment 3 shows a user interface for performing the embodiment of the invention. In order to automatically optimize the electro-optical conditions shown in Embodiment 1 and Embodiment 2, it is necessary to create an electro-optical condition in which various conditions are specified.

Therefore, in an electro-optical condition setting box shown in FIG. 11, a box for setting the electro-optical conditions described in Embodiment 1 and Embodiment 2 is displayed on a screen of the input and output unit 324 (see FIG. 3A).

For example, the condition setting unit 32221 sets a plurality of electro-optical conditions based on information of a reference value, a swing width, and a step width of an aperture angle or a focal-point height received from the input and output unit 324 via the electro-optical condition setting box shown in FIG. 11.

Further, in Embodiment 2, since depth information of the measurement target is required, a measurement target information input box shown in FIG. 12 is displayed on the screen of the input and output unit 324 (see FIG. 3A).

For example, the storage unit 323 stores a plurality of electro-optical conditions in which combinations of the aperture angle and the focal-point height of the electron beam 302 are different. Then, the condition setting unit 32221 reads out the electro-optical conditions stored in the storage unit 323 to set an electro-optical condition based on condition group information for optimizing the electro-optical condition received from the input and output unit 324 via the measurement target information input box shown in FIG. 12.

According to Embodiment 3, items that require user input can be specified via the input and output unit 324.

REFERENCE SIGN LIST

001: scanning electron microscope system
300: imaging optical system
321: control unit
322: calculation unit
323: storage unit
324: input and output unit
301: electron gun
302: primary electron beam
303: condenser lens
304: deflector
305: objective lens
306: scintillator
308: stage
310: BSE
311: optical fiber
312: photo multiplier
313: image generation unit
320: sample

The invention claimed is:
1. An electronic microscope device, comprising:
an imaging optical system configured to irradiate a sample having a step with an electron beam, detect a reflected electron generated from the sample, and convert the reflected electron into an electric signal; and
a processor in communication with the imaging optical system, the processor having a storage means and causing the device to:
generate an image using the electric signal converted by the imaging optical system;
process the generated image to measure a dimension of a lower surface of the sample;
generate, from a plurality of electro-optical conditions, an electro-optical condition under which a prescribed measurement performance is obtained by using a relationship between each electro-optical condition and an index of a measurement performance;
store the generated electro-optical condition in the storage; and
adjust, when the sample is irradiated with the electron beam, the electron beam by reading out the electro-optical condition from the storage, wherein
the generation of the electro-optical condition includes:
setting, as a plurality of the electro-optical conditions, a plurality of electro-optical conditions in which combinations of an aperture angle and a focal-point height for the electron beam are different;
determining an index of the measurement performance in the set electro-optical conditions; and
deriving the electro-optical conditions including the aperture angle and the focal-point height, such that the determined index of the measurement performance becomes a prescribed value.

2. The electronic microscope device according to claim 1, the processor in communication with the imaging optical system further causing the device to:
input information, and
set the plurality of electro-optical conditions based on information of a reference value, a swing width, and a step width of the aperture angle or the focal-point height received from the inputted information.

3. The electronic microscope device according to claim 1, the processor in communication with the imaging optical system further causing the device to:
input information,
store the plurality of electro-optical conditions in which the combinations of the aperture angle and the focal-point height of the electron beam are different, and
read out the electro-optical conditions stored in the storage to set the electro-optical condition based on the input condition group information for setting the electro-optical condition to a prescribed condition.

4. The electronic microscope device according to claim 1, the processor in communication with the imaging optical system further causing the device to:
use, as the index of the measurement performance, the measured dimension of the lower surface of the sample.

5. The electronic microscope device according to claim 1, the processor in communication with the imaging optical system further causing the device to:
measure a dimensions of an upper surface of the sample, and
use, as the index of the measurement performance, a difference between the dimension of the lower surface and the measured dimension of the upper surface of the sample.

6. The electronic microscope device according to claim 1, the processor in communication with the imaging optical system further causing the device to:

use sharpness of the generated image as the index of the measurement performance.

7. The electronic microscope device according to claim 6, the processor in communication with the imaging optical system further causing the device to:
use, as the sharpness, a sum of squares of differences between each pixel in the image and an adjacent pixel thereof.

8. The electronic microscope device according to claim 1, the processor in communication with the imaging optical system further causing the device to:
use, as the index of the measurement performance, a diameter of the electron beam from the upper surface of the sample to a depth which is obtained based on a shape of the electron beam.

9. The electronic microscope device according to claim 8, the processor in communication with the imaging optical system further causing the device to:
use an average diameter or a maximum diameter of the electron beam as the diameter of the electron beam.

10. The electronic microscope device according to claim 1, the processor in communication with the imaging optical system further causing the device to:
use, as the index of the measurement performance, a difference between diameters of the electron beam at an upper surface of the sample and at the lower surface of the sample.

11. The electronic microscope device according to claim 1, the processor in communication with the imaging optical system further causing the device to:
derive, as the electro-optical condition under which the index is the prescribed value, an electro-optical condition under which the index of the measurement performance is the largest based on the relationship between the plurality of electro-optical conditions and the index of the measurement performance.

12. The electronic microscope device according to claim 1, the processor in communication with the imaging optical system further causing the device to:
derive, as the electro-optical condition under which the index is the prescribed value, an electro-optical condition under which the index of the measurement performance is the smallest based on the relationship between the plurality of electro-optical conditions and the index of the measurement performance.

13. The electronic microscope device according to claim 12, the processor in communication with the imaging optical system further causing the device to:
derive, as the electro-optical condition under which the index of the measurement performance is the smallest, an electro-optical condition under which the index of the measurement performance is zero.

14. The electronic microscope device according to claim 1, the processor in communication with the imaging optical system further causing the device to:
derive the electro-optical condition under which the index is the prescribed value by using linear interpolation or interpolation by a quadric surface based on the relationship between the plurality of electro-optical conditions and the index of the measurement performance.

15. The electronic microscope device according to claim 1, the processor in communication with the imaging optical system further causing the device to:
process the generated image using the electro-optical condition stored in the storage in the same manufacturing process among a plurality of manufacturing processes, and measure the dimension of the lower surface of the sample.

* * * * *